United States Patent
Ito et al.

(10) Patent No.: US 10,457,829 B2
(45) Date of Patent: Oct. 29, 2019

(54) PHOTOCURABLE RESIN COMPOSITION FOR TRANSFERRING SURFACE FREE ENERGY AND METHOD FOR PRODUCING SUBSTRATE USING SAME

(71) Applicant: DEXERIALS CORPORATION, Tokyo (JP)

(72) Inventors: Makiya Ito, Tokyo (JP); Kyungsung Yun, Tokyo (JP); Hirofumi Kondo, Tokyo (JP)

(73) Assignee: DEXERIALS CORPORATION, Tokyo (JP)

(*) Notice: Subject to any disclaimer, the term of this patent is extended or adjusted under 35 U.S.C. 154(b) by 360 days.

(21) Appl. No.: 15/314,850

(22) PCT Filed: May 7, 2015

(86) PCT No.: PCT/JP2015/063232
§ 371 (c)(1),
(2) Date: Nov. 29, 2016

(87) PCT Pub. No.: WO2015/182341
PCT Pub. Date: Dec. 3, 2015

(65) Prior Publication Data
US 2017/0204285 A1 Jul. 20, 2017

(30) Foreign Application Priority Data

May 30, 2014 (JP) .................. 2014-112350

(51) Int. Cl.
| | | |
|---|---|---|
| *C08F 2/48* | (2006.01) |
| *C08F 2/46* | (2006.01) |
| *C09D 135/02* | (2006.01) |
| *C08F 2/50* | (2006.01) |
| *C09D 201/00* | (2006.01) |
| *B05D 3/06* | (2006.01) |
| *C08F 222/10* | (2006.01) |
| *C09D 133/16* | (2006.01) |
| *C09D 4/00* | (2006.01) |
| *G03F 7/004* | (2006.01) |
| *G03F 7/027* | (2006.01) |
| *G03F 7/031* | (2006.01) |
| *G03F 7/00* | (2006.01) |

(52) U.S. Cl.
CPC ........... *C09D 135/02* (2013.01); *B05D 3/067* (2013.01); *C08F 2/50* (2013.01); *C08F 222/1006* (2013.01); *C09D 4/00* (2013.01); *C09D 133/16* (2013.01); *C09D 201/00* (2013.01); *G03F 7/0002* (2013.01); *G03F 7/0046* (2013.01); *G03F 7/027* (2013.01); *G03F 7/031* (2013.01); *C08F 2800/20* (2013.01); *C08L 2312/06* (2013.01)

(58) Field of Classification Search
CPC ...... C09D 135/02; C09D 133/16; C09D 4/00; C09D 201/00; C08L 2312/06; C08F 2800/20; C08F 222/1006; C08F 2/50; G03F 7/004
USPC ......................... 427/508, 487, 457
See application file for complete search history.

(56) References Cited

U.S. PATENT DOCUMENTS

| | | | |
|---|---|---|---|
| 2003/0002161 A1 | 1/2003 | Nagasawa et al. | |
| 2006/0159849 A1 | 7/2006 | Morita et al. | |
| 2007/0177271 A1* | 8/2007 | Matsunaga | G02B 1/111 359/582 |
| 2008/0008888 A1* | 1/2008 | Chang | C09D 133/16 428/421 |
| 2013/0075360 A1 | 3/2013 | Nakamura et al. | |
| 2013/0084459 A1* | 4/2013 | Larson | C09J 4/00 428/422 |
| 2016/0124305 A1* | 5/2016 | Ito | C03C 17/008 430/18 |

FOREIGN PATENT DOCUMENTS

| | | |
|---|---|---|
| JP | 2003-240916 A | 8/2003 |
| JP | 2005-052686 A | 3/2005 |
| JP | 2010-170041 A | 8/2010 |
| JP | 2015-115384 A | 6/2015 |
| WO | WO-2014199910 A1 * 12/2014 ........... C03C 17/008 |

OTHER PUBLICATIONS

International Search Report dated Jul. 14, 2015, for corresponding International Patent Application No. PCT/JP2015/063232. (With English Translation).
Written Opinion dated Jul. 14, 2015, for corresponding International Patent Application No. PCT/JP2015/063232.
International Preliminary Report on Patentability dated Sep. 13, 2016, for corresponding International Patent Application No. PCT/JP2015/063232. (With English Translation).

* cited by examiner

*Primary Examiner* — Jessica Whiteley
(74) *Attorney, Agent, or Firm* — Pergament & Cepeda LLP; Milagros A. Cepeda; Edward D. Pergament

(57) ABSTRACT

The present application provides a photocurable resin composition for transferring surface free energy, the photocurable resin composition including a first compound exhibiting low surface free energy, a second compound exhibiting surface free energy higher than the surface free energy of the first compound, and a photopolymerization initiator, wherein a difference in transmittance of the photocurable resin composition to a wavelength of 450 nm between before and after addition of the first compound is less than 79.3%, and a method for producing a substrate using the photocurable resin composition.

19 Claims, 8 Drawing Sheets

PHOTOCURABLE RESIN COMPOSITION FOR TRANSFERRING SURFACE FREE ENERGY AND METHOD FOR PRODUCING SUBSTRATE USING SAME

This application is a National Phase application under 35 U.S.C. 371 of International Application No. PCT/JP2015/063232, filed on May 7, 2015, which claims priority to Japanese provisional application No. 2014-112350, filed on May 30, 2014, all of which are hereby incorporated by references in their entireties.

TECHNICAL FIELD

The present invention relates to a photocurable resin composition for transferring surface free energy, where the photocurable resin composition is configured to transfer of surface free energy of a master, and a method for producing a substrate using the photocurable resin composition.

BACKGROUND ART

As methods for performing pattern coating onto a base, single wafer processing and continuous processing have been known. As systems for performing pattern coating, screen printing, gravure printing, roll coating, and die coating have been proposed. Along with developments in printed electronics, moreover, there is a need for high precision using printing methods.

In the above-mentioned systems, coating devices used for applying coating liquids have complicated structures. When a coating pattern is changed, therefore, a device for use needs to be significantly changed. Moreover, excellent pattern shapes can be obtained with a coating liquid having relatively high viscosity, but pattern shapes cannot be maintained with a liquid of low viscosity because the liquid flows after the coating.

In order to improve the above-described problems, Japanese Patent Application Laid-Open (JP-A) No. 2005-52686 proposes a base on part of which surface modification is performed to control wettability of a coating liquid. However, a formation method is complicated because surface modification is performed with radial rays through a mask.

Moreover, JP-A No. 2003-240916 proposes that a surface having surface free energy differences is prepared by using a photocurable resin composition, in which a photocurable resin composition (a) having high surface free energy and a compound (b) having low surface free energy, exposing the resin composition to light with bringing the resin composition into contact with a medium of low surface free energy, and secondary exposing the resin composition with bringing the resin composition into contact with a medium of high surface free energy.

When an ink is applied onto a surface having surface free energy differences, however, defects, such as partial unintentional repelling of the ink on an area to which the ink should be completely deposited, may be caused.

SUMMARY OF INVENTION

Technical Problem

The present invention is proposed based on the aforementioned current situations in the art, and provide a photocurable resin composition for transferring surface free energy, where the photocurable resin composition can suppress defects, such as unintentional repelling, and a method for producing a substrate using the photocurable resin composition.

Solution to Problem

The present inventors have diligently performed researches, and as a result the present inventors have found that defects, such as unintentional repelling of an ink, can be prevented by a photocurable resin composition for transferring surface free energy having certain transmittance.

Namely, a photocurable resin composition for transferring surface free energy according to present invention includes a first compound exhibiting low surface free energy, a second compound exhibiting surface free energy higher than the surface free energy of the first compound, and a photopolymerization initiator, wherein a difference in transmittance of the photocurable resin composition to a wavelength of 450 nm between before and after addition of the first compound is less than 79.3%.

Moreover, a photocurable resin composition for transferring surface free energy according to present invention includes a first compound exhibiting low surface free energy, a second compound exhibiting surface free energy higher than the surface free energy of the first compound, and a photopolymerization initiator,
wherein a transmittance of the photocurable resin composition to a wavelength of 450 nm is greater than 9.6%.

Moreover, a method for producing a substrate according to the present invention includes applying, onto a base, the photocurable resin composition for transferring surface free energy, and curing the photocurable resin composition with bringing the photocurable resin composition into contact with a master, to which a pattern has been formed with surface free energy differences, to thereby form, on the base, a cured resin layer to which the pattern of the master has been transferred.

Moreover, the substrate of the present invention is formed by the above-mentioned method.

Advantageous Effects of the Invention

The present invention can suppress defects, such as unintentional repelling, because the photocurable resin composition for transferring surface free energy has certain transmittance.

DESCRIPTION OF EMBODIMENTS

Figure 1:
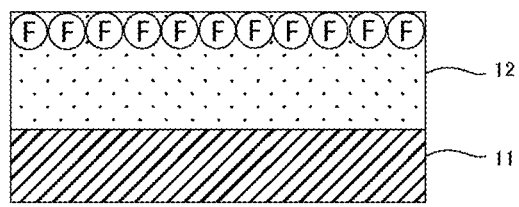
FIG. 1 is a cross-sectional view illustrating an outline of the coating step.

The embodiments of the present invention are specifically described in the following order with reference to drawings, hereinafter.

1. Photocurable resin composition for transferring surface free energy
2. Production method of substrate
3. Substrate
4. Examples <1. Photocurable Resin Composition for Transferring Surface Free Energy>

A photocurable resin composition for transferring surface free energy (referred to as a "resin composition" hereinafter) according to the first embodiment includes a first compound exhibiting low surface free energy, a second compound exhibiting surface free energy higher than the surface free energy of the first compound, and a photopolymerization initiator, where a difference in transmittance of the photocurable resin composition to a wavelength of 450 nm between before and after addition of the first compound is less than 79.3%.

Moreover, a resin composition according to the second embodiment includes a first compound exhibiting low surface free energy, a second compound exhibiting surface free energy higher than the surface free energy of the first compound, and a photopolymerization initiator, wherein a transmittance of the photocurable resin composition to a wavelength of 450 nm is greater than 9.6%.

Since the photocurable resin composition for transferring surface free energy has certain transmittance as described above, the first compound is sufficiently dissolved, and therefore defects, such as unintentional repelling of an ink, can be prevented.

The first compound, the second compound, and the photopolymerization initiator are described hereinafter.

[First Compound]

As the first compound, a surface adjusting agent, such as so-called "an anti-blocking agent," "a slipping agent," "a leveling agent," and "an antifouling agent" can be used. A fluororesin-based compound or a silicone resin-based compound is preferably used as the first compound. Examples of a fluororesin-based compound include perfluoropolyether group-containing (meth)acrylate and perfluoroalkyl group-containing (meth)acrylate. Examples of the silicone resin-based compound include a polydimethylsiloxane-containing compound and polyalkylsiloxane-containing (meth)acrylate. The above-listed examples may be used alone or in combination. Among the above-listed examples, perfluoropolyether group-containing (meth)acrylate is preferably used as the first compound in view of solubility. Note that, in the present specification, the term "(meth)acrylate" includes both acrylic acid ester (acrylate) and methacrylic acid ester (methacrylate).

When an amount of the first compound in the resin composition is too small, a pattern formed with surface free energy differences cannot be obtained. When the amount is too large, a difference in the surface free energy tends to be small. Accordingly, the amount of the first compound in the resin composition is preferably 0.01 parts by mass or greater but 10 parts by mass or less, more preferably 0.5 parts by mass or greater but 5 parts by mass or less relative to 100 parts by mass of the second compound.

[Second Compound]

The second compound is not limited as long as the second compound is a compound exhibiting surface free energy higher than the surface free energy of the first compound. Examples of the second compound include monofunctional (meth)acrylate, bifunctional (meth)acrylate, and trifunctional or higher (meth)acrylate.

Examples of the monofunctional (meth)acrylate include polyalkylene glycol ester monomers and alkyl (meth)acrylate including straight chain or branched chain alkyl group. Specific examples of the polyalkylene glycol ester monomers include hydroxyethyl (meth)acrylate, hydroxypropyl (meth)acrylate, polyethylene glycol mono(meth)acrylate, polypropylene glycol mono(meth)acrylate, polybutylene glycol mono(meth)acrylate, and polyethylene glycol polypropylene glycol mono(meth)acrylate. The above-listed examples can be used alone or in combination. Among the above-listed examples, polyethylene glycol mono(meth)acrylate can be preferably used in view of reactivity, crosslinkability, and surface hardness.

Specific examples of the bifunctional (meth)acrylate include tricyclodecane dimethanol di(meth)acrylate, dimethylol-tricyclodecane di(meth)acrylate, bisphenol AEO-modified di(meth)acrylate, 1,9-nonanediol di(meth)acrylate, 1,10-decanediol di(meth)acrylate, 2-hydroxy-3-acryloyloxypropyl (meth)acrylate, propoxylated bisphenol A di(meth)acrylate, diethylene glycol di(meth)acrylate, neopentyl glycol di(meth)acrylate, 1,4-butanediol di(meth)acrylate, polyethylene glycol (200) di(meth)acrylate, tetraethylene glycol di(meth)acrylate, polyethylene glycol (400) di(meth)acrylate, cyclohexane dimethanol di(meth)acrylate, alkoxylated hexanediol di(meth)acrylate, alkoxylated cyclohexane dimethanol di(meth)acrylate, ethoxylated (4) bisphenol A di(meth)acrylate, ethoxylated (10) bisphenol A di(meth)acrylate, polyethylene glycol (600) di(meth)acrylate, alkoxylated neopentyl glycol di(meth)acrylate, dioxane glycol di(meth)acrylate, and isocyanuric acid EO-modified di(meth)acrylate. The above-listed examples can be used alone or in combination. Among the above-listed examples, tricyclodecane dimethanol di(meth)acrylate can be preferably used in view of reactivity, crosslinkability, and surface hardness.

Specific examples of the trifunctional or higher (meth)acrylate include pentaerythritol tri(meth)acrylate, EO-modified pentaerythritol tri(meth)acrylate, isocyanuric acid EO-modified tri(meth)acrylate, ε-caprolactone-modified tris-(-2-acryloxyethyl)isocyanurate, trimethylol propane tri(meth)acrylate, ε-caprolactone-modified tris(acryloxyethyl)(meth)

acrylate, ethoxylated (20) trimethylol propane tri(meth) acrylate, propoxylated (3) trimethylol propane tri(meth) acrylate, propoxylated (6) trimethylol propane tri(meth) acrylate, ethoxylated (9) trimethylol propane tri(meth) acrylate, propoxylated (3) glyceryl tri(meth)acrylate, ethoxylated (4) pentaerythritol tetra(meth)acrylate, pentaerythritol tetra(meth)acrylate, ditrimethylolpropane tetra (meth)acrylate, dipentaerythritol penta(meth)acrylate, EO-modified dipentaerythritol penta(meth)acrylate, and dipentaerythritol hexa(meth)acrylate. The above-listed examples can be used alone or in combination. Among the above-listed examples, pentaerythritol tri(meth)acrylate can be preferably used in view of reactivity, crosslinkability, and surface hardness.

In the present embodiment, as the second compound, monofunctional (meth)acrylate, bifunctional (meth)acrylate, and trifunctional or higher (meth)acrylate are preferably used in combination. When an amount of the bifunctional (meth)acrylate relative to 100 parts by mass of the second compound is too small, reactivity and crosslinkability tend to be low. When the amount is too large, solubility of the first compound is low to decrease transmittance. Accordingly, the amount of bifunctional (meth)acrylate is preferably 30 parts by mass or greater but 80 parts by mass or less, and more preferably 40 parts by mass or greater but 70 parts by mass or less.

[Photopolymerization Initiator]

The photopolymerization initiator is appropriately selected from photoradical polymerization initiators known in the art for use. Examples of the photopolymerization initiator include acetophenone-based photopolymerization initiators, benzyl ketal-based photopolymerization initiators, and phosphorus-based photopolymerization initiators. The above-listed examples can be used alone or in combination.

Specific examples of the photopolymerization initiator available on market, as the acetophenone-based photopolymerization initiator, include 1-hydroxycyclohexylphenylketone (IRGACURE 184, available from BASF Japan Ltd.), 2-hydroxy-2-methyl-1-phenyl-propan-1-one (DAROCUR 1173, available from BASF Japan Ltd.), 2,2-dimethoxy-2-phenylacetophenone (IRGACURE 651, available from BASF Japan Ltd.), 1-[4-(2-hydroxyethoxy)-phenyl]-2-hydroxy-2-methyl-1-propan-1-one (IRGACURE 2959, available from BASF Japan Ltd.), and 2-hydroxy-1-{4-[2-hydroxy-2-methyl-propionyl]-benzyl}phenyl}-2-methyl-propan-1-one (IRGACURE 127, available from BASF Japan Ltd.). Moreover, specific examples of the photopolymerization initiator available on market, as the benzyl ketal-based photopolymerization initiator, include benzophenone, fluorenone, dibenzosuberone, 4-aminobenzophenone, 4,4'-diaminobenzophenone, 4-hydroxybenzophenone, 4-chlorobenzophenone, and 4,4'-dichlorobenzophenone. Specific examples of the photopolymerization initiator available on market, as the phosphorous-based photopolymerization initiator, include bis(2,4,6-trimethylbenzoyl)-phenylphosphine oxide (IRGACURE 819, available from BASF Japan Ltd.), and 2,4,6-trimethylbenzoyl-diphenylphosphine oxide (DAROCURE TPO, available from BASF Japan Ltd.). Among the above-listed examples, the acetophenone-based photopolymerization initiator is preferably used in view of smooth photocuring.

When an amount of the photopolymerization initiator in the resin composition is too small, low adhesion or insufficient hardness tends to occur due to low curing ability. When the amount is too large, properties, such as adhesion, are insufficient due to problems in polymerization. Accordingly, the amount of the photopolymerization initiator in the resin composition is preferably 0.1 parts by mass or greater but 10 parts by mass or less, and more preferably 1 part by mass or greater but 5 parts by mass or less, relative to 100 parts by mass of the second compound.

[Other Additives]

Moreover, the resin composition can further includes additives, such as a solvent, a leveling agent, a hue adjusting agent, a colorant, a UV-absorber, an antistatic agent, and various thermoplastic resin materials, as long as the additives do not adversely affect an obtainable effect of the present invention.

[Transmittance of Resin Composition]

The resin composition according to the first embodiment include a first compound, a second compound, and a photopolymerization initiator, where a difference in transmittance of the photocurable resin composition to a wavelength of 450 nm between before and after addition of the first compound is less than 79.3%, preferably 10% or less. Since the difference in transmittance to a wavelength of 450 nm between before and after the addition of the first compound is a certain value or less, the first compound is completely dissolved and therefore defects, such as unintentional repelling of an ink, can be prevented.

Note that, the difference in transmittance to a wavelength of 450 nm can be determined by using a UV-visible light absorptiometer and calculating based on the following equation.

Transmittance difference $\Delta T$=[transmittance of the resin composition before adding the first compound]−[transmittance of the resin composition after adding the first compound]

Transmittance measuring conditions: quartz cell/10 mm, control/air

Moreover, the resin composition according to the second embodiment includes a first compound exhibiting low surface free energy, a second compound exhibiting surface free energy higher than the surface free energy of the first compound. And a photopolymerization initiator, wherein a transmittance of the photocurable resin composition to a wavelength of 450 nm is greater than 9.6%, more preferably 80% or greater. Since the transmittance to a wavelength of 450 nm after adding the first compound is a certain value or greater as described above, the first compound is completely dissolved, and therefore defects, such as unintentional repelling of an ink, can be prevented.

When surface free energy of a glass master, to which fluorine coating has not been applied, is transferred to the above-described resin composition, a concentration of fluorine atoms is 3% or less. Moreover, a contact angle of water is 55° or less, when surface free energy of a glass master, to which fluorine coating has not been applied, is transferred. Moreover, a contact angle of hexadecane is 10° or less, when surface free energy of a glass master, to which fluorine coating has not been applied, is transferred. Moreover, surface free energy is 47 mJ/cm$^2$ or greater, when surface free energy of a glass master, to which fluorine coating has not been applied, is transferred. Specifically, movement of the first compound is not inhibited at a contact surface with glass according to the resin composition of the present embodiment, relatively high surface free energy of the glass can be highly precisely transferred.

<2. Method for Producing Substrate>

A method for producing a substrate using the above-described resin composition is described next. The method for producing a substrate according to the present embodiment includes applying, onto a base, the above-mentioned photocurable resin composition, and curing the photocurable resin composition with bringing the photocurable resin composition into contact with a master, to which a pattern has been formed with surface free energy differences, to thereby form, on the base, a cured resin layer to which the pattern of the master has been transferred.

Each step is described through FIGS. 1 and 2 hereinafter. Note that, in FIGS. 1 and 2, the fluororesin-based compound is listed as an example of the first compound, but the first compound is not limited to the fluororesin-based compound.

FIG. 1 is a cross-sectional view illustrating an outline of a coating step. The coating step includes applying a resin composition 12 onto a base 11. A bar coater, a spray coater, or a spin coater can be used for the coating.

The base 11 is not particularly limited, and polyethylene terephthalate (PET), glass, or polyimide can be used as the base 11. Moreover, a transparent material or an opaque material can be used as the base 11. In the case where a UV-curable resin composition is used as the resin composition 12, ultraviolet rays can be applied from the side of the base 11 by using, as the base 11, a transparent material that transmits ultraviolet rays.

Figure 2:
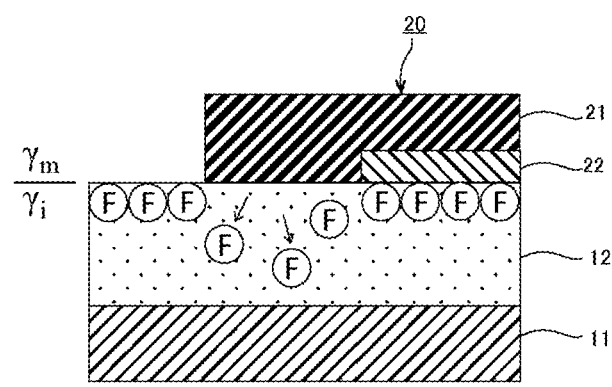
FIG. 2 is a cross-sectional view illustrating an outline of the curing step.

FIG. 2 is a cross-sectional view illustrating an outline of a curing step. In this curing step, the resin composition 12 is cured with bringing into contact with a master 20 to which a pattern is formed with surface free energy differences, to thereby form a cured resin layer to which a pattern of the master 20 has been transferred, on the base 11.

The master 20 includes a higher surface free energy region 21 and a low surface free energy region 22 at the surface of the master 20. For example, the high surface free energy region 21 is a region of silicon, metal (e.g., aluminum and copper), glass, silicon oxide, and metal oxide (e.g., aluminum oxide), and the low surface free energy region 22 is a region of a low surface free energy coating film (e.g., fluorine coating and silicone coating) or inert gas (e.g., nitrogen and carbon dioxide).

The base of the master 20 is preferably glass to which fluorine coating is easily performed. Moreover, the surface of the master 20 is preferably smooth. As a result, surface migrations of the first compound and the second compound become easy, and a surface of the cured resin layer can be made smooth.

In the case where the master 20 is brought into contact with the resin composition 12, as illustrated in FIG. 2, a state of an interface between the master 20 and the resin composition 12 is that the first compound at the surface of the resin composition moves to the low surface free energy region 22 of the master 20 and the second compound moves to the high surface free energy region 21 because $\Delta\gamma$ specified by the following formula tries to be small.

$$\Delta\gamma = \gamma_m - \gamma_i$$

In the formula above, $\gamma_m$ is surface free energy of the surface of the master 20 and $\gamma_i$ is surface free energy of the surface of the resin composition 12.

Accordingly, for example, the fluororesin-based compound moves to the low surface free energy region 22, such as a fluorine coating region, and is removed from an interface of the high surface free energy region 21, as illustrated in FIG. 2. Then, the resin composition 12 is cured in the state where the master 20 is in contact with the resin composition 12, to thereby form a cured resin layer, to which the pattern of the master 20 has been transferred, on the base 11. The curing method of the resin composition 12 can be appropriately selected depending on a type of the resin for use. For example, energy line (e.g., heat, and ultraviolet rays) irradiation can be used.

Moreover, the method preferably further includes, after the curing step, applying an ink composition onto the cured resin layer and curing the ink composition. As the ink composition, for example, a composition, which has the same formulation to that of the resin composition 12, with proviso that the first compound is removed, can be used. The applied ink composition is selectively applied on the high surface free energy area of the pattern formed body.

As described above, a pattern of the surface free energy differences of the master 20 can be repeatedly transferred by using the master 20. Moreover, the transferred pattern of the surface free energy differences is excellent in terms of fine pitch, and size stability. Moreover, the cured coating film thereof has excellent transparency.

<3. Substrate>

Figure 3:
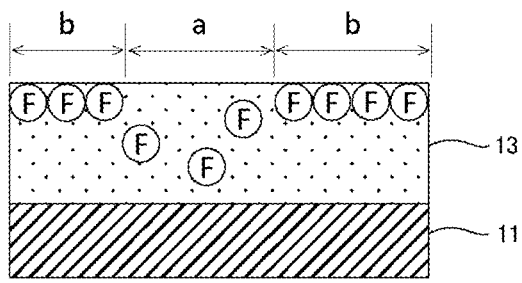
FIG. 3 is a cross-sectional view illustrating one example of the substrate.

Next, the substrate formed by the above-described method for producing a substrate is described. FIG. 3 is a cross-sectional view illustrating one example of the substrate. The substrate includes, on the base 11, a cured resin layer 13, a surface of which has a high surface free energy region a and a low surface free energy region b.

The base 11 is identical to a substrate produced by the above-described method for producing a pattern formed body, and the cured resin layer 13 is a cured product of the resin composition 12 used in the above-described method for producing a pattern formed body.

The substrate according to the present embodiment can provide a smooth pattern surface through smoothing of a transfer surface of the master 20. Then, a processed pattern having fine pitches and excellent size stability can be attained by processing the smooth pattern surface with an ink composition or the like. Accordingly, the substrate can be applied for the electronic field, such as electronic circuit patterns, or a biomedical field, such as DNA chips.

EXAMPLES

<4. Examples>

Examples of the present invention are specifically described hereinafter. In Examples, a resin composition including a first compound exhibiting low surface free energy and a second compound exhibiting surface free energy higher than the surface free energy of the first compound was prepared, transmittance of the resin composition before and after adding the first compound was measured to evaluate solubility. Moreover, surface free energy of Master A, of which surface free energy was low over the entire surface, Master B, of which surface free energy was high over the entire surface, and Master C, of which a pattern had been formed with surface free energy differences, was respectively transferred to the resin composition. Contact angles, surface free energy γ, a concentration of F atoms, and presence of unintentional repelling were evaluated. Note that, the present invention is not limited to these examples.

As for the exposure devices, contact angle gauge, microscope, atomic force microscope (AFM), absorptiometer, and photoelectron spectrometer, the following devices were used.

Exposure Device A: Mask Aligner MA-20 (available from MIKASA CO., LTD.)

Exposure Device B: Alignment exposure device (available from Toshiba Lighting & Technology Corporation)

Contact Angle Gauge: DM-701 (available from Kyowa Interface Science Co., Ltd.)

Microscope: VHX-1000 (available from Keyence Corporation)

AFM: SPA400 (available from Hitachi High-Tech Science Corporation)

Absorptiometer: V-560 UV/Vis spectrophotometer (available from JASCO Corporation)

Photoelectron spectrometer: AXIS-HS (available from Shimadzu/KRATOS)

Moreover, the resin composition was prepared by adding the following ingredients.

TMM-3L: pentaerythritol triacrylate (available from Shin-Nakamura Chemical Co., Ltd.)

A-DCP: tricyclodecane dimethanol diacrylate (available from Shin-Nakamura Chemical Co., Ltd.)

AE-400: polyethylene glycol monoacrylate #400 (available from NOF Corporation)

KY-1203: perfluoropolyether-containing acrylate (available from Shin-Etsu Chemical Co., Ltd.)

IRGACURE 184: 1-hydroxycyclohexylphenylketone (available from BASF)

[Measurement of Transmittance]

The resin composition before or after adding KY-1203, which was the first compound, was poured into a quartz cell having a light path length of 10 mm, and transmittance of the resin composition before or after the addition of the first compound relative to light having a wavelength of 450 nm was measured at 25° C. by means of an absorptiometer (control:air). Moreover, a difference ΔT in transmittance between the resin composition before the addition of the first compound and the resin composition after the addition of the first compound was calculated according to the equation below.

Transmittance difference ΔT=(light transmittance of the resin composition before adding the first compound)−(light transmittance of the resin composition after adding the first compound)

[Production of Master A]

A microscope slide in the size of 7 cm×5 cm was washed with a cleaning fluid (product name: Novec7300, manufactured by 3M Company). Thereafter, a fluorine coating agent (product name: DURASURF DS-5210F, manufactured by HARCES Co., Ltd.) was applied onto the microscope slide dropwise. After leaving the slide to stand overnight, the slide was washed with a cleaning fluid (product name: Novec7300, manufactured by 3M Company). Thereafter, a fluorine coating agent (product name: DURASURF DS-5210F, manufactured by HARCES Co., Ltd.) was applied onto the microscope slide dropwise. After leaving the resulting slide to stand overnight, the slide was washed with a cleaning fluid (product name: Novec7300, manufactured by 3M Company), to thereby obtain Master A (entire surface of which was coated with fluorine).

[Production of Master B]

A fresh microscope slide in the size of 7 cm×5 cm was provided as Master B.

[Production of Master C]

A negative photoresist (product name: OFPR-800LB, manufactured by Tokyo Ohka Kogyo Co., Ltd.) was applied onto a glass substrate in the size of 10 cm×10 cm by spin coating, and the applied photoresist was dried for 90 seconds at 110° C. on a hot plate. The substrate coated with the photoresist, and a photomask, to which lines and spaces of 5 μm had been patterned, were set, and subjected to exposure by means of Exposure Device 1. After the exposure, the substrate was immersed in a 2.38% tetramethyl ammonium hydroxide aqueous solution for 1 minute, and then was immersed in pure water for 1 minute, followed by drying at room temperature, to thereby perform developing.

The developed substrate was washed with pure water, and then with a cleaning fluid (product name: Novec7300, manufactured by 3M Company) in this order. Thereafter, a fluorine coating agent (product name: DURASURF DS-5210F, manufactured by HARCES Co., Ltd.) was applied onto the substrate dropwise. After leaving to stand overnight, the resultant was washed with a cleaning fluid (product name: Novec7300, manufactured by 3M Company). Thereafter, a fluorine coating agent (product name: DURASURF DS-5210F, manufactured by HARCES Co., Ltd.) was applied thereon dropwise. The resultant was further left to stand overnight, and then washed with a cleaning fluid (product name: Novec7300, manufactured by 3M Company), followed by drying at room temperature.

Figure 4:
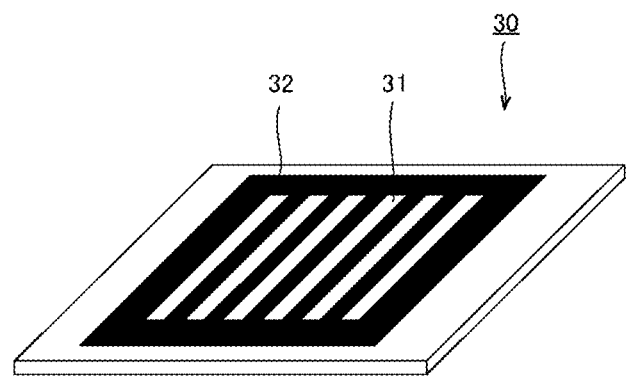
FIG. 4 is a perspective view illustrating an outline of Master C.

The substrate was immersed in a stripping solution for 5 minutes to remove the remaining resist film, and then washed with acetone, and with a cleaning fluid (product name: Novec7300, manufactured by 3M Company) in this order. As a result, Master C, in which the high surface free energy region 31 and the low surface free energy region 32 had been patterned (partially fluorine coated) on the glass substrate 30, as illustrated in FIG. 4, was obtained.

[Production of Coating Film]

Figure 5:
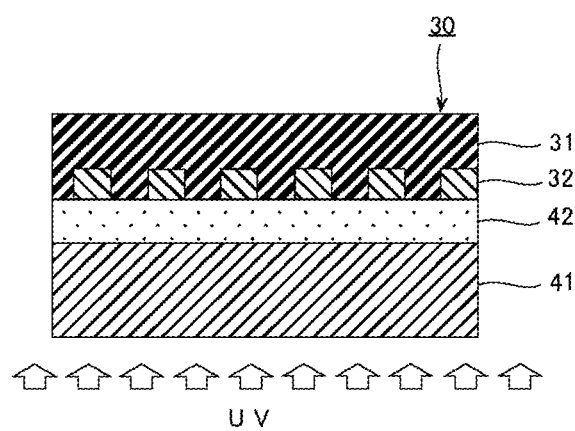
FIG. 5 is a cross-sectional view illustrating an outline of a curing step including curing a resin composition using Master C.

FIG. 5 is a cross-sectional view illustrating an outline of the curing step where the resin composition is cured using Master C. As illustrated in FIG. 5, the resin composition 42 was applied (wet film thickness: 8 μm) onto a PET film 41 by a bar coater. The applied resin composition was brought into close contact with the master 30, and then cured by exposing the PET surface to light by means of Exposure Device B to form a cured resin layer, to which the surface free energy of the master 30 had been transferred. The radiation dose of the exposure was 6 J/cm$^2$. The master 30 was released to obtain a coating film including the PET film 41 and the cured resin layer. Moreover, coating films were obtained from Master A and Master B in the same manner.

[Measurements of Contact Angle and Surface Free Energy]

A contact angle with water and contact angle with hexadecane were measured on the coating film obtained from Master A or Master B using the coating angle gauge. Moreover, the surface free energy γ was calculated in accordance with the Kaelble-Wu method.

[Measurement of Concentration of F Atoms]

A concentration (%) of F atom on a surface of the coating film obtained from Master A or Master B was measured by means of the photoelectron spectrometer.

[Evaluation on Presence of Unintentional Repelling]

The coating film obtained by curing the resin composition using Master C was painted with an oil-based ink pen, and the deposition state of the ink was observed under the microscope. As for the oil-based ink pen, a commercially available pen, "Mackee" manufactured by ZEBRA CO., LTD. was used. The coating film on which unintentional repelling of the ink was observed was evaluated as "present" and the coating film on which unintentional repelling of the ink was not observed was evaluated as "not present."

Example 1

Figure 6A:
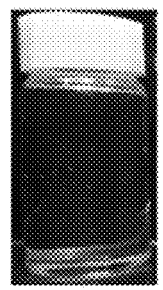
FIG. 6A is a photograph depicting an external appearance of the solution after adding the first compound in Example 1.

As presented in Table 1, the transmittance of the solution, to which 35 parts by mass of TMM-3L, 60 parts by mass of A-DCP, 5 parts by mass of AE-400, and 3 parts by mass of IRGACURE 184 were added, was 90.3%, and the transmittance of the solution, to which 1 part by mass KY-1203 was further added, was 88.5%. Moreover, the difference ΔT in the transmittance of the resin composition between before and after the addition of the first compound was 1.8%. Moreover, the resin composition before adding KY-1203 was colorless transparent and the resin composition after adding KY-1203 was also colorless transparent as depicted in FIG. 6A.

Figure 7:
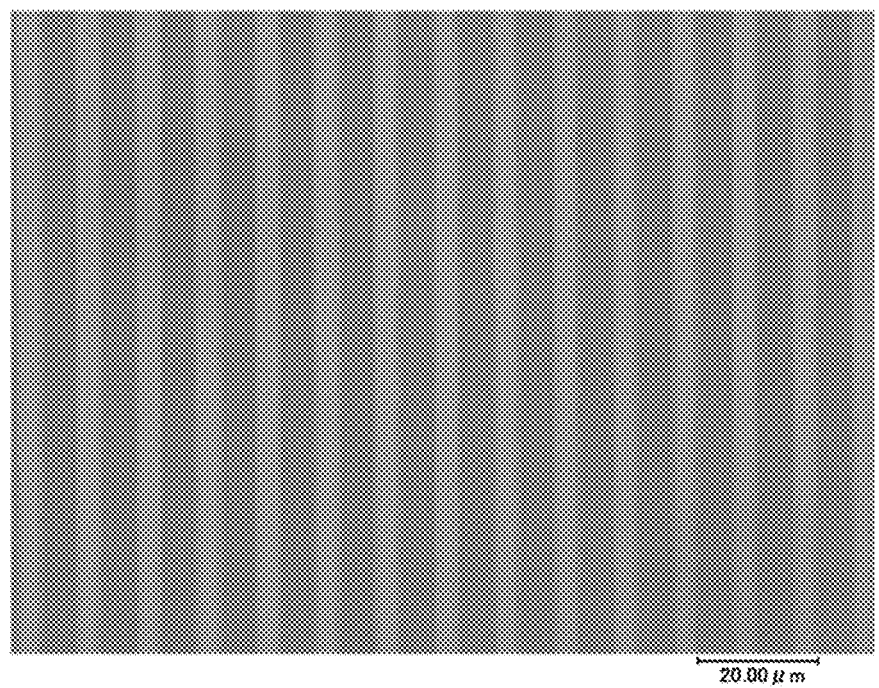
FIG. 7 is a photomicrograph of a surface of a coating film, to which Master C of Example 1 has been transferred, where the surface is painted with an oil-based ink pen.

A contact angle of water on the cured resin layer, to which the surface free energy of Master A had been transferred using the resin composition of Example 1 was 106.4°, a contact angle of hexadecane on the cured resin layer was 54.2°, surface free energy on the cured resin layer was 18.2 mJ/cm$^2$, and a concentration of F atoms on the cured resin layer was 31.9%. Moreover, a contact angle of water on the cured resin layer, to which the surface free energy of Master B had been transferred using the resin composition of Example 1 was 53.9°, a contact angle of hexadecane on the cured resin layer was 9.1°, surface free energy on the cured resin layer was 49.3 mJ/cm$^2$, and a concentration of F atoms on the cured resin layer was 0%. FIG. 7 is a photomicrograph of a surface of the coating film, to which the pattern of Master C has been transferred, when the surface of the coating film is painted with an oil-based ink pen. As depicted in FIG. 7, the evaluation on the unintentional repelling of the ink on the cured resin layer to which the surface free energy of Master C had been transferred as "not present."

Example 2

Figure 6B:
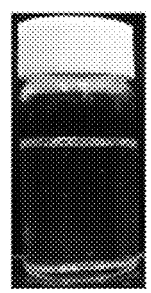
FIG. 6B is a photograph depicting an external appearance of the solution after adding the first compound in Example 2.

As presented in Table 1, the transmittance of the solution, to which 30 parts by mass of TMM-3L, 65 parts by mass of A-DCP, 5 parts by mass of AE-400, and 3 parts by mass of IRGACURE 184 were added, was 90.4%, and the transmittance of the solution, to which 1 part by mass KY-1203 was further added, was 88.4%. Moreover, the difference ΔT in the transmittance of the resin composition between before and after the addition of the first compound was 2.0%. Moreover, the resin composition before adding KY-1203 was colorless transparent and the resin composition after adding KY-1203 was also colorless transparent as depicted in FIG. 6B.

Figure 8:
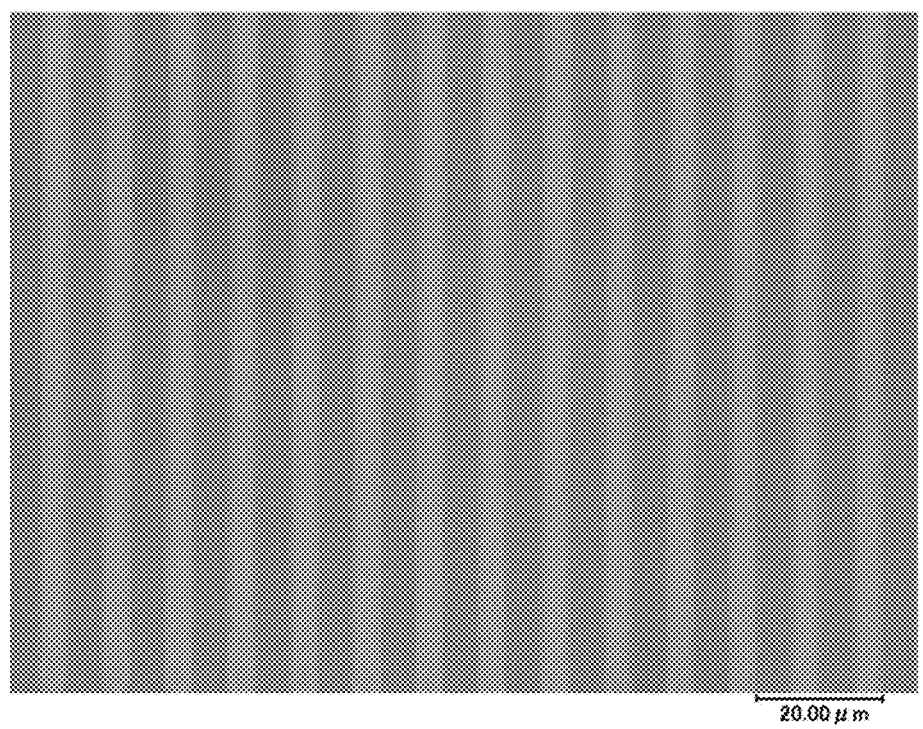
FIG. 8 is a photomicrograph of a surface of a coating film, to which Master C of Example 2 has been transferred, where the surface is painted with an oil-based ink pen.

A contact angle of water on the cured resin layer, to which the surface free energy of Master A had been transferred using the resin composition of Example 2 was 110.3°, a contact angle of hexadecane on the cured resin layer was 52.9°, surface free energy on the cured resin layer was 18.0 mJ/cm$^2$, and a concentration of F atoms on the cured resin layer was 31.4%. Moreover, a contact angle of water on the cured resin layer, to which the surface free energy of Master B had been transferred using the resin composition of Example 2 was 54.1°, a contact angle of hexadecane on the cured resin layer was 9.1°, surface free energy on the cured resin layer was 49.1 mJ/cm$^2$, and a concentration of F atoms on the cured resin layer was 0%. FIG. 8 is a photomicrograph of a surface of the coating film, to which the pattern of Master C has been transferred, when the surface of the coating film is painted with an oil-based ink pen. As depicted in FIG. 8, the evaluation on the unintentional repelling of the ink on the cured resin layer to which the surface free energy of Master C had been transferred as "not present."

Example 3

Figure 6C:
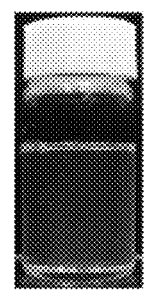
FIG. 6C is a photograph depicting an external appearance of the solution after adding the first compound in Example 3.

As presented in Table 1, the transmittance of the solution, to which 25 parts by mass of TMM-3L, 70 parts by mass of A-DCP, 5 parts by mass of AE-400, and 3 parts by mass of IRGACURE 184 were added, was 89.6%, and the transmittance of the solution, to which 1 part by mass KY-1203 was further added, was 84.4%. Moreover, the difference ΔT in the transmittance of the resin composition between before and after the addition of the first compound was 5.2%. Moreover, the resin composition before adding KY-1203 was colorless transparent, but the resin composition after adding KY-1203 was slightly cloudy with a slight tint of blue as depicted in FIG. 6C.

Figure 9:
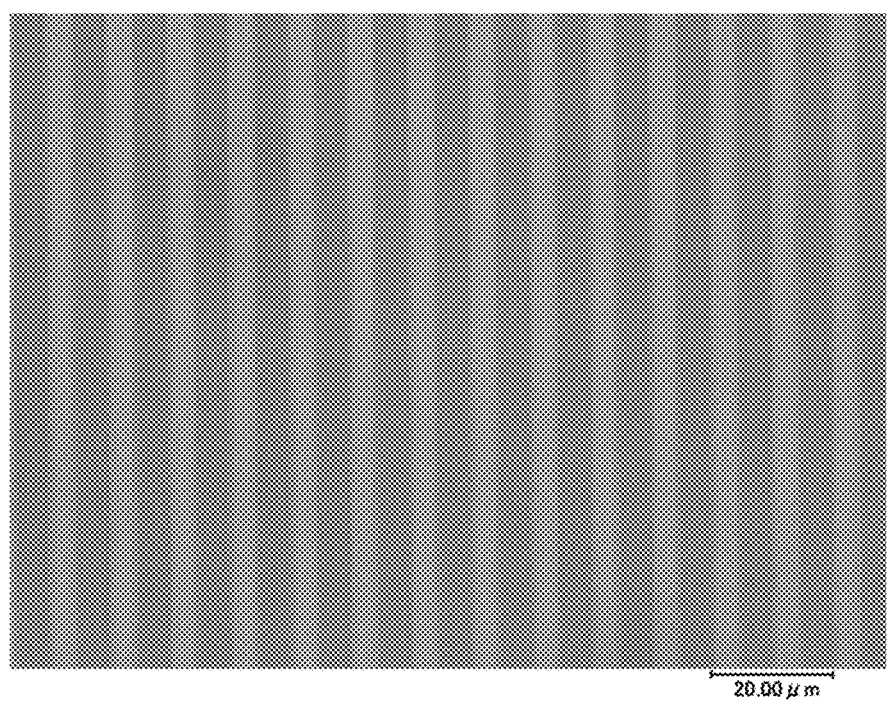
FIG. 9 is a photomicrograph of a surface of a coating film, to which Master C of Example 3 has been transferred, where the surface is painted with an oil-based ink pen.

A contact angle of water on the cured resin layer, to which the surface free energy of Master A had been transferred using the resin composition of Example 3 was 110.3°, a contact angle of hexadecane on the cured resin layer was 52.6°, surface free energy on the cured resin layer was 18.1 mJ/cm$^2$, and a concentration of F atoms on the cured resin layer was 31.7%. Moreover, a contact angle of water on the cured resin layer, to which the surface free energy of Master B had been transferred using the resin composition of Example 3 was 53.8°, a contact angle of hexadecane on the cured resin layer was 7.0°, surface free energy on the cured resin layer was 49.4 mJ/cm$^2$, and a concentration of F atoms on the cured resin layer was 0%. FIG. 9 is a photomicrograph of a surface of the coating film, to which the pattern of Master C has been transferred, when the surface of the coating film is painted with an oil-based ink pen. As depicted in FIG. 9, the evaluation on the unintentional repelling of the ink on the cured resin layer to which the surface free energy of Master C had been transferred as "not present."

Comparative Example 1

Figure 6D:
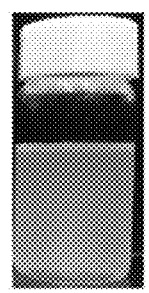
FIG. 6D is a photograph depicting an external appearance of the solution after adding the first compound in Comparative Example 1.

As presented in Table 1, the transmittance of the solution, to which 20 parts by mass of TMM-3L, 75 parts by mass of A-DCP, 5 parts by mass of AE-400, and 3 parts by mass of IRGACURE 184 were added, was 88.9%, and the transmittance of the solution, to which 1 part by mass KY-1203 was further added, was 9.6%. Moreover, the difference ΔT in the transmittance of the resin composition between before and after the addition of the first compound was 79.3%. Moreover, the resin composition before adding KY-1203 was colorless transparent, but the resin composition after adding KY-1203 was clouded in white as in the photograph of FIG. 6D.

Figure 10:
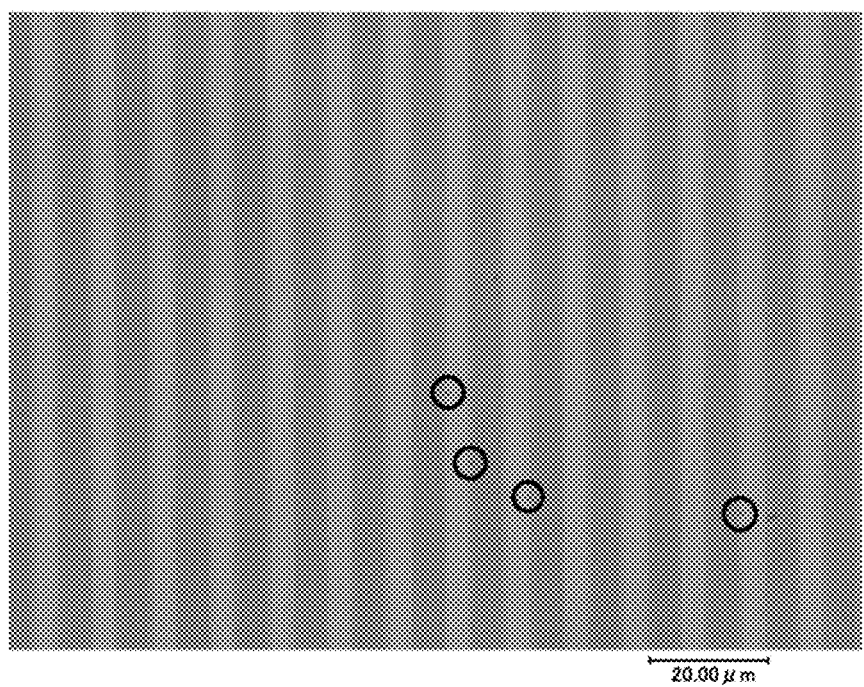
FIG. 10 is a photomicrograph of a surface of a coating film, to which Master C of Comparative Example 1 has been transferred, where the surface is painted with an oil-based ink pen.

A contact angle of water on the cured resin layer, to which the surface free energy of Master A had been transferred using the resin composition of Comparative Example 1 was 109.0°, a contact angle of hexadecane on the cured resin layer was 54.4°, surface free energy on the cured resin layer was 17.7 mJ/cm$^2$, and a concentration of F atoms on the cured resin layer was 33.0%. Moreover, a contact angle of water on the cured resin layer, to which the surface free energy of Master B had been transferred using the resin composition of Comparative Example 1 was 57.8°, a contact angle of hexadecane on the cured resin layer was 18.4°, surface free energy on the cured resin layer was 46.1 mJ/cm$^2$, and a concentration of F atoms on the cured resin layer was 7.4%. FIG. 10 is a photomicrograph of a surface of the coating film, to which the pattern of Master C has been transferred, when the surface of the coating film is painted with an oil-based ink pen. As depicted in FIG. 10, unintentional repelling of the ink, as appeared as black circles, was observed on the cured resin layer to which the surface free energy of Master C had been transferred, and the evaluation on the unintentional repelling of the ink was "present."

Comparative Example 2

Figure 6E:
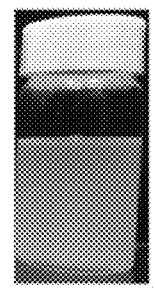
FIG. 6E is a photograph depicting an external appearance of the solution after adding the first compound in Comparative Example 2.

As presented in Table 1, the transmittance of the solution, to which 15 parts by mass of TMM-3L, 80 parts by mass of A-DCP, 5 parts by mass of AE-400, and 3 parts by mass of IRGACURE 184 were added, was 90.3%, and the transmittance of the solution, to which 1 part by mass KY-1203 was further added, was 0.9%. Moreover, the difference ΔT in the transmittance of the resin composition between before and after the addition of the first compound was 89.4%. Moreover, the resin composition before adding KY-1203 was colorless transparent, but the resin composition after adding KY-1203 was clouded in white as in the photograph of FIG. 6E.

A contact angle of water on the cured resin layer, to which the surface free energy of Master A had been transferred using the resin composition of Comparative Example 2 was 106.9°, a contact angle of hexadecane on the cured resin layer was 52.6°, surface free energy on the cured resin layer was 18.5 mJ/cm$^2$, and a concentration of F atoms on the cured resin layer was 32.9%. Moreover, a contact angle of water on the cured resin layer, to which the surface free energy of Master B had been transferred using the resin composition of Comparative Example 2 was 60.5°, a contact angle of hexadecane on the cured resin layer was 21.1°, surface free energy on the cured resin layer was 44.2 mJ/cm$^2$, and a concentration of F atoms on the cured resin layer was 4.1%. Moreover, the evaluation on the unintentional repelling of the ink on the cured resin layer to which the surface free energy of Master C had been transferred using the resin composition of Comparative Example 2 was "present."

TABLE 1

| | | Ex. 1 | Ex. 2 | Ex. 3 | Comp. Ex. 1 | Comp. Ex. 2 |
|---|---|---|---|---|---|---|
| Resin composition | TMM-3L | 35 | 30 | 25 | 20 | 15 |
| | A-DCP | 60 | 65 | 70 | 75 | 80 |
| | AE-400 | 5 | 5 | 5 | 5 | 5 |
| | Irg184 | 3 | 3 | 3 | 3 | 3 |
| | KY-1203 | 1 | 1 | 1 | 1 | 1 |
| | Transmittance (%) at 450 nm before adding KY-1203 | 90.3 | 90.4 | 89.6 | 88.9 | 90.3 |
| | Transmittance (%) at 450 nm after adding KY-1203 | 88.5 | 88.4 | 84.4 | 9.6 | 0.9 |
| | ΔT (%) | 1.8 | 2.0 | 5.2 | 79.3 | 89.4 |
| Master A | Contact angle of water (°) | 106.4 | 110.3 | 110.3 | 109.0 | 106.9 |
| | Contact angle of HD (°) | 54.2 | 52.9 | 52.6 | 54.4 | 52.6 |
| | γ (mJ/cm$^2$) | 18.2 | 18.0 | 18.1 | 17.7 | 18.5 |
| | F (%) | 31.9 | 31.4 | 31.7 | 33.0 | 32.9 |
| Master B | Contact angle of water (°) | 53.9 | 54.1 | 53.8 | 57.8 | 60.5 |
| | Contact angle of HD (°) | 9.1 | 9.1 | 7.0 | 18.4 | 21.1 |
| | γ (mJ/cm$^2$) | 49.3 | 49.1 | 49.4 | 46.1 | 44.2 |
| | F (%) | 0 | 0 | 0 | 7.4 | 4.1 |
| Master C | Presence of repelling | Not present | Not present | Not present | Present | Present |

As presented in Table 1, it was found that surfaces having low surface free energy were formed on all of the resin compositions of Examples 1 to 3 and Comparative Examples 1 and 2 by the transfer of Master A.

In Examples 1 to 3, the surface free energy on the transferred surface of Master B (glass) was high and fluorine atoms were not detected even by the measurement of X-ray photoelectron spectroscopy (ESCA). Accordingly, it was found that the high surface free energy area where no fluorine atom was present was formed.

In Comparative Examples 1 and 2, on the other hand, the contact angles of water and hexadecane on the transferred surfaces of Master B (glass) were higher than the transferred surfaces of Examples 1 to 3, and the surface free energy was low. Moreover, the concentrations of fluorine atoms were higher than the concentrations of Examples 1 to 3. It was considered that the above-mentioned results demonstrated restriction of the movements of molecules including fluorine.

Since the transmittance difference between before and after the addition of the first compound to the resin composition was less than 79.3%, more preferably 5.2% or less, as in Examples 1 to 3, unintentional repelling of the ink on the ink deposited area did not occur. Since the transmittance after the addition of the first compound to the resin composition was greater than 9.6%, more preferably 84.4% or greater, as in Examples 1 to 3, moreover, unintentional repelling of the ink on the ink deposited area did not occur.

In Comparative Examples 1 and 2, on the other hand, a problem, such as the oil-based ink was partially repelled on the ink deposited area, was confirmed. Specifically, it was found that, when the transmittance difference between before and after the addition of the first compound to the resin composition was 79.3% or greater, or the transmittance after the addition of the first compound to the resin composition was 9.6% or less, the surface free energy could not be controlled as expected, and unintentional repelling of the ink occurred.

REFERENCE SIGNS LIST

11: base, 12: resin composition, 20: master, 21: high surface free energy region, 22 low surface free energy region, 30: glass substrate, 31: high surface free energy region, 32: low surface free energy region, 41: PET film, 42: resin composition

The invention claimed is:

1. A photocurable resin composition for transferring surface free energy, the photocurable resin composition comprising:
   a first compound exhibiting low surface free energy;
   a second compound exhibiting surface free energy higher than the surface free energy of the first compound; and
   a photopolymerization initiator,
   wherein the second compound comprises monofunctional (meth)acrylate, bifunctional (meth)acrylate and trifunctional or higher (meth)acrylate; and
   wherein a difference in transmittance of the photocurable resin composition to a wavelength of 450 nm between before and after addition of the first compound is less than 79.3%.

2. The photocurable resin composition for transferring surface free energy according to claim 1, wherein the difference in transmittance between before and after addition of the first compound is 10% or less.

3. The photocurable resin composition for transferring surface free energy according to claim 1, wherein the first compound is perfluoropolyether group-containing (meth)acrylate.

4. The photocurable resin composition for transferring surface free energy according to claim 1, wherein the photopolymerization initiator is an acetophenone-based photopolymerization initiator.

5. The photocurable resin composition for transferring surface free energy according to claim 1, wherein when surface free energy of a glass master is transferred, a concentration of fluorine atoms is 3% or less.

6. The photocurable resin composition for transferring surface free energy according to claim 1, wherein when surface free energy of a glass master is transferred, a contact angle of water is 55° or less.

7. The photocurable resin composition for transferring surface free energy according to claim 1, wherein when surface free energy of a glass master is transferred, a contact angle of hexadecane is 10° or less.

8. The photocurable resin composition for transferring surface free energy according to claim 1, wherein when surface free energy of a glass master is transferred, surface free energy of the photocurable resin composition is 47 mJ/cm$^2$ or greater.

9. A photocurable resin composition for transferring surface free energy, the photocurable resin composition comprising:
a first compound exhibiting low surface free energy;
a second compound exhibiting surface free energy higher than the surface free energy of the first compound; and
a photopolymerization initiator,
wherein a transmittance of the photocurable resin composition to a wavelength of 450 nm is greater than 9.6%, wherein the second compound comprises monofunctional (meth)acrylate, bifunctional (meth)acrylate and trifunctional or higher (meth)acrylate.

10. The photocurable resin composition for transferring surface free energy according to claim 9, wherein the transmittance is 80% or greater.

11. A method for producing a substrate, the method comprising:
applying, onto a base, the photocurable resin composition for transferring surface free energy according to claim 1; and
curing the photocurable resin composition with bringing the photocurable resin composition into contact with a master, to which a pattern has been formed with surface free energy differences, to thereby form, on the base, a cured resin layer to which the pattern of the master has been transferred.

12. The method for producing a substrate according to claim 11, wherein a surface of the cured resin layer is smooth.

13. The method for producing a substrate according to claim 11, further comprising:
applying an ink composition onto the cured resin layer, and curing the ink composition.

14. A substrate formed by the method according to claim 11.

15. A method for producing a substrate, the method comprising:
applying, onto a base, the photocurable resin composition for transferring surface free energy according to claim 9; and
curing the photocurable resin composition with bringing the photocurable resin composition into contact with a master, to which a pattern has been formed with surface free energy differences, to thereby form, on the base, a cured resin layer to which the pattern of the master has been transferred.

16. The method for producing a substrate according to claim 15, wherein a surface of the cured resin layer is smooth.

17. The method for producing a substrate according to claim 15, further comprising:
applying an ink composition onto the cured resin layer, and curing the ink composition.

18. A substrate formed by the method according to claim 15.

19. The photocurable resin composition for transferring surface free energy according to claim 1, wherein the amount of bifunctional (meth)acrylate relative to 100 parts by mass of the second compound is 30 parts by mass or greater but 80 parts by mass or less.

* * * * *